(12) United States Patent
Lee et al.

(10) Patent No.: US 6,287,938 B2
(45) Date of Patent: Sep. 11, 2001

(54) METHOD FOR MANUFACTURING SHALLOW TRENCH ISOLATION IN SEMICONDUCTOR DEVICE

(75) Inventors: Ki-Yeup Lee; Byoung-Ju Kang, both of Ichon-shi (KR)

(73) Assignee: Hyundai Electronics Industries Co., Ltd., Ichon-shi (KR)

( * ) Notice: Subject to any disclaimer, the term of this patent is extended or adjusted under 35 U.S.C. 154(b) by 0 days.

(21) Appl. No.: 09/735,952

(22) Filed: Dec. 14, 2000

(30) Foreign Application Priority Data

Dec. 24, 1999 (KR) .................................................. 99-62192

(51) Int. Cl.⁷ .................................................. H01L 21/76
(52) U.S. Cl. ............................................ 438/424; 438/719
(58) Field of Search .................................. 438/424, 435, 438/437, 296, 780, 781, 713, 714, 719, 734

(56) References Cited

U.S. PATENT DOCUMENTS

| | | | |
|---|---|---|---|
| 5,618,379 | * | 4/1997 | Armacost et al. ..................... 438/595 |
| 5,719,085 | * | 2/1998 | Moon et al. .......................... 438/424 |
| 5,807,789 | * | 9/1998 | Chen et al. ........................... 438/714 |

* cited by examiner

*Primary Examiner*—John F. Niebling
*Assistant Examiner*—Angel Roman
(74) *Attorney, Agent, or Firm*—Jacobson Holman, PLLC

(57) ABSTRACT

A method for manufacturing a trench isolation in a semiconductor device, wherein the method includes the steps of: forming a wide rounded convex shape at an upper portion of the trench by a first etching of high polymerization; forming a vertical sidewall at the middle of the trench by a second etching of low polymerization; and forming a narrow rounded concave shape at the bottom portion of the trench by a third etching of high polymerization, thereby forming the trench isolation.

9 Claims, 2 Drawing Sheets

METHOD FOR MANUFACTURING SHALLOW TRENCH ISOLATION IN SEMICONDUCTOR DEVICE

FIELD OF THE INVENTION

The present invention relates to a method for manufacturing a semiconductor memory device; and, more particularly, to a method for manufacturing a shallow trench isolation in a semiconductor device with an enhanced profile, whereby residual stress concentration is capable of being prevented.

DESCRIPTION OF THE PRIOR ART

As is well known, a dynamic random access memory (DRAM) having a memory cell comprised of a transistor and a capacitor has a higher degree of integration mainly by down-sizing through micronization.

Therefore, as the device dimension becomes reduced in the memory cell, the dimensions of active regions and the space therebetween are accordingly reduced as well. Isolation regions, which play an important role in preventing current leakage between two adjacent devices, become narrow which results in several problems occurring mainly due to the high integration of the device. The narrow isolation structure is thinner for a field oxide (FOX) layer in the narrow space between the adjacent active regions. Therefore, the FOX layer cannot effectively perform its isolation. Moreover, during the formation of the FOX layer, a bird's peak occurs at the edge of the active region so that a current leakage may occur on the gate oxide layer.

To overcome the above problem, a trench isolation structure is proposed and widely used for the semiconductor memory device with high integration, e.g., 1 Gigabit DRAM to 4 Gigabit DRAM application, wherein a trench region is formed in a silicon substrate of the semiconductor with a depth that is enough for isolating the adjacent devices.

Therefore, a method for manufacturing the conventional trench isolation comprises the steps of forming a pad oxide or nitride layer on a silicon substrate, selectively etching the pad oxide or nitride layer, and dry etching the silicon substrate by using the patterned pad oxide or the nitride layer as a mask.

The conventional trench isolation has a drawback, which is that a compressive stress concentrates on a bottom portion of the trench due to thermal budget during processes, such as annealing and other thermal treatment processes. Therefore, defects in the silicon substrate move easily so that the morphology of the trench sidewall deteriorates and dislocations occur easily. Dislocations are apt to occur more easily due to the concentration of the compressive stress around the bottom portion of the trench when the trench experiences the thermal budget.

SUMMARY OF THE INVENTION

It is, therefore, an object of the present invention to provide a method for manufacturing a trench isolation in a semiconductor device with an enhanced profile, whereby residual stress concentration is capable of being prevented.

In accordance with one aspect of the present invention, there is provided a method for manufacturing a trench isolation, the method comprising the steps of: a) forming a wide rounded convex shape at an upper portion of the trench by a first etching of high polymerization; b) forming a vertical sidewall at the middle of the trench by a second etching of low polymerization; and c) forming a narrow rounded concave shape at the bottom portion of the trench by a third etching of high polymerization.

BRIEF DESCRIPTION OF THE DRAWINGS

The above and other objects and features of the present invention will become apparent from the following description of the preferred embodiments given in conjunction with the accompanying drawings, in which.

DETAILED DESCRIPTION OF THE PREFERRED EMBODIMENTS

Figure 1:
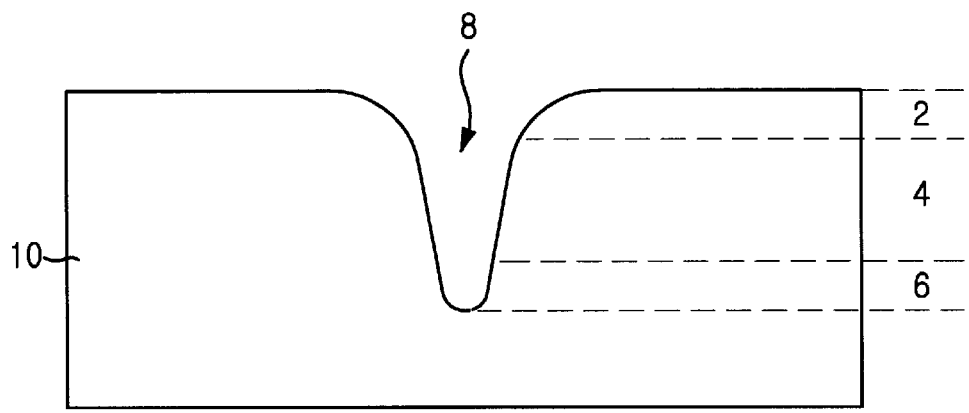
FIGS. 1 and 2 show cross sectional views setting forth manufacturing steps for forming a trench isolation in accordance with a preferred embodiment of the present invention.
Figure 2:
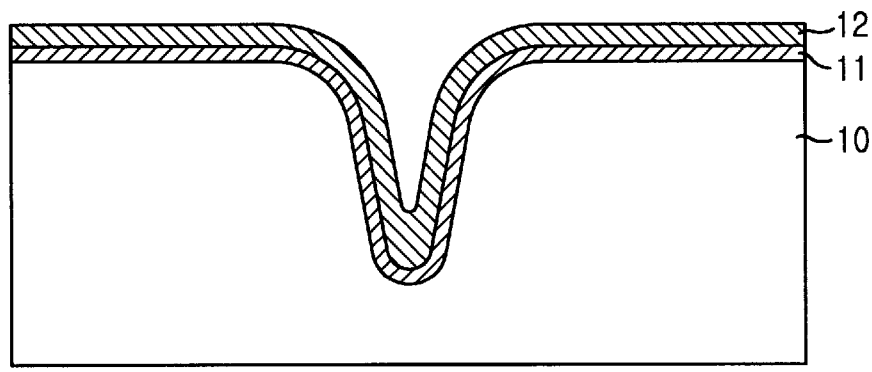
Figure 3:
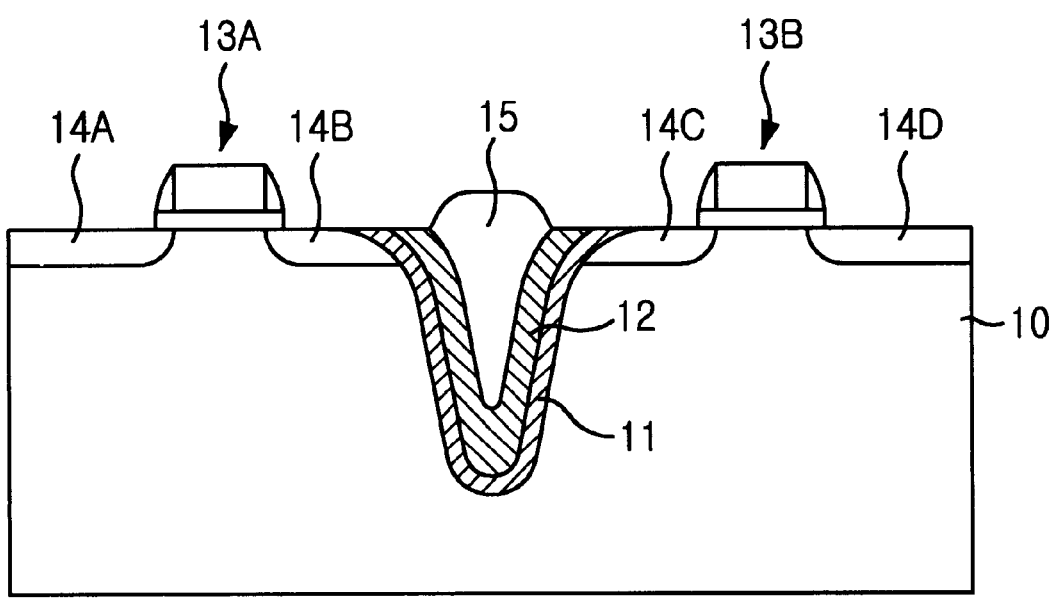
FIG. 3 is a schematic cross sectional view of a semiconductor device having the trench isolation structure of the present invention.

There are provided in FIGS. 1 to 3 cross sectional views setting forth a method for manufacturing a trench isolation in accordance with a preferred embodiment of the present invention. It should be noted that like parts appearing in FIGS. 1 to 3 are represented by like reference numerals.

To begin with, a silicon substrate 10 is selectively etched to form a trench profile that is capable of reducing a compressive stress geometrically around the trench profile. That is, an etching process is carried out by using a mask pattern provided with a pad oxide or nitride layer (not shown), wherein a first etching process is carried out to obtain a rounded upper portion 2 of the trench 8 under conditions of low voltage and lots of polymer, a second etching process is carried out to obtain a vertical middle portion 4 under high voltage and a small amount of polymer, and a third etching process is carried out to obtain a rounded bottom portion 6 under low voltage and lots of polymer as similar to the first etching conditions. Each etching step is illustrated in more detail hereinafter.

In the first etching step, it is performed preferably on condition that RF power is 100~200 W, pressure is 50~60 mTorr, flux of chlorine gas ($Cl_2$) is 10~20 sccm, and flux of nitrogen gas ($N_2$) is 15~25 sccm. Since the first etching step is performed under low RF power and $N_2$ rich ambient to produce lots of polymer, it is possible to obtain a convex shape of a rounding profile at the upper portion 2 of the trench 8.

In the second etching step, it is performed preferably on condition that RF power is 400~500 W, pressure is 30~40 mTorr, flux of $Cl_2$ is 15~25 sccm, flux of sulfur hexafluoride ($SF_6$) is 25~40 scam, and flux of $N_2$ is 0~10 sccm. As the fluorine radical increases under high RF power and low pressure, a removal capability for polymer and silicon also increases. Thus, the middle portion 4 of the trench 8 becomes close to the vertical sidewall.

In the third etching step, it is performed preferably on condition that RF power is 100~200 W, pressure is 50~60 mTorr, flux of chlorine gas ($Cl_2$) is 10~20 sccm, and flux of nitrogen gas ($N_2$) is 23~30 sccm. Since the third etching step is performed under low RF power and $N_2$ rich ambient to produce lots of polymer, which is similar to the first etching step, it is possible to obtain a narrow concave shape of a rounded profile at the bottom portion 6 of the trench 8.

After the third etching step, a thermal treatment, i.e., annealing, is carried out to move defects produced during the etching steps toward a surface of the trench and to release the stress concentration due to the edge profile of the trench 8. The annealing process is performed preferably at 950~1,200° C. for 10~40 minutes. After annealing the substrate 10 having the trench profile, the substrate 10 is washed in phosphoric acid ($H_3PO_4$) at 80~120° C. so that defects on the surface of the trench 8 can be removed. To improve the removal capability, $H_3PO_4$ washing step can be repeatedly carried out two times or more.

In the next step, the defects moved toward the trench surface during the annealing process are removed by using a method of a wet oxidization to form an oxide layer and a wet etching to remove the oxide layer. Here, wet oxidization process is performed preferably on the condition that the temperature is 400~500° C., oxygen gas fluxes ($O_2$), $H_2$ and $N_2$ are 2~8 sccm, 3~8 sccm and 1~3 sccm, respectively, to form an oxide layer with a thickness ranging from approximately 100 Å to 300 Å. The wet etching process is carried out by using an etchant such as a hydro fluoride (HF) solution or a buffered oxide etchant (BOE). To improve the removal capability, the wet oxidization and etching processes can be repeatedly carried out two times or more.

In the next step, a thin nitride film 11 is deposited uniformly on the surface of the trench 8 to the thickness of approximately 20~100 Å, and then, subsequently, an oxide film 12 is formed on the nitride layer 11 to the thickness of approximately 500 Å using a dry oxidization process, as shown in FIG. 2. In more detail, the formation of the nitride film 11 is performed preferably on condition that pressure is 200~300 mTorr, temperature is 600~700° C., concentration of $NH_3$ and dichlorosilane (DCS) is less than 1 sccm. The formation of the oxide film 12 is performed preferably on condition that temperature is 700~800° C., fluxes of $O_2$, $N_2$, $H_2$ are 5~20 sccm, 1~3 sccm and 1~6 sccm, respectively.

Thereafter, another annealing process is carried out to release the stress concentration induced by expansion of silicon and the oxide film 12. At this time, a stress direction moves from the silicon substrate 10 to the oxide film 12 by means of the nitride film 11.

Finally, insulating material, e.g., made of polimyde or undoped polysilicon is filled into the trench and then made flat by using a method such as a chemical mechanical polishing (CMP).

Referring to FIG. 3, there is shown a semiconductor device having a trench isolation with enhanced profile to reduce the compressive stress around the bottom portion of the trench in accordance with the present invention. Here, reference numerals 13A and 13B denote transistors, 14A, 14B, 14C and 14D denote diffusion or retrograde regions, and 15 denote insulating material.

In comparison with the prior art, the present invention provides an advantage in that the enhanced trench profile permits the compressive stress to be uniformly-distributed geometrically. The trench profile has the shape of the upper portion 2, which is a wide round convex shape, and the bottom portion 6, which is a narrow rounded concave shape. The defects in the silicon substrate 10 can be removed during the annealing and the oxidization process. Furthermore, the trench surface deformation which causes the dislocation can be effectively prevented by forming the nitride film thereon. With regard to device characteristics, the dangling bond can be removed and the leakage current is also prohibited by inhibiting the penetration of impurities.

Although the preferred embodiments of the invention have been disclosed for illustrative purposes, those skilled in the art will appreciate that various modifications, additions and substitutions are possible, without departing from the scope and spirit of the invention as disclosed in the accompanying claim.

What is claimed is:

1. A method for manufacturing a trench isolation, comprising the steps of:
    a) forming a wide rounded convex shape at an upper portion of the trench by a first etching of high polymerization;
    b) forming a vertical sidewall at a middle of the trench by a second etching of low polymerization; and
    c) forming a narrow rounded concave shape at a bottom portion of the trench by a third etching of high polymerization, thereby forming the trench isolation.

2. The method as recited claim 1, wherein the step a) is carried out using a RF power of 100~200 W, a pressure of 50~60 mTorr, a flux of chlorine gas ($Cl_2$) of 10~20 sccm, and nitrogen gas ($N_2$) of 15~25 sccm.

3. The method as recited in claim 1, wherein the step b) is carried out using a RF power of 400~500 W, a pressure of 30~40 mTorr, a flux of $Cl_2$ of 15~25 sccm, a flux of sulfur hexafluoride ($SF_6$) of 25~40 sccm, and a flux of $N_2$ of 15~25 sccm.

4. The method as recited in claim 1, wherein the step c) is carried out using a RF power of 100~200 W, a pressure of 50~60 mTorr, a flux of $Cl_2$ of 10~20 sccm, and a flux of $N_2$ of 23~30 sccm.

5. The method as recited in claim 1, after the step c), further comprising the steps of:
    d) removing defects produced from the etching steps by annealing process for moving the defects on a surface area and by washing a substrate at least one time in phosphoric acid ($H_3PO_4$);
    e) forming a first oxide film by oxidizing the surface of the trench and removing the first oxide film by wet etching, at least one time;
    f) forming a nitride and a second oxide films on whole the trench surface; and
    g) annealing the substrate again, thereby a stress direction moving from the substrate toward the second oxide film.

6. The method as recited in claim 5, wherein the nitride film is formed to a thickness ranging from 20 to 100 Å.

7. The method as recited in claim 5, wherein the annealing process is carried out at 950~1,200° C. for 10~40 minutes.

8. The method as recited in claim 5, wherein the step e) is carried out under the condition that a thickness of the first oxide film is 100~300 Å, a temperature is 400~500° C., and fluxes of $O_2$, $H_2$ and $N_2$ are 2~8 sccm, 3~8 sccm and 1~3 sccm, respectively.

9. The method as recited in claim 8, wherein the first oxide film is removed by using an etchant such as hydro fluoride (HF) solution or buffered oxide etchant (BOE).

* * * * *